United States Patent

Yamada et al.

[11] Patent Number: 5,808,324
[45] Date of Patent: Sep. 15, 1998

[54] LIGHT EMITTING DEVICE

[75] Inventors: Masato Yamada; Makoto Kawasaki, both of Gunma-ken, Japan

[73] Assignee: Shin-Etsu Handotai Co., Ltd, Tokyo, Japan

[21] Appl. No.: 527,611

[22] Filed: Sep. 13, 1995

[30] Foreign Application Priority Data

Sep. 28, 1994 [JP] Japan .................................. 6-258922

[51] Int. Cl.$^6$ .................................................. H01L 33/00
[52] U.S. Cl. ............................ 257/96; 257/101; 257/102
[58] Field of Search ............................ 257/96, 101, 102, 257/103

[56] References Cited

U.S. PATENT DOCUMENTS 5,172,195 12/1992 Sekiwa ...................................... 257/96
5,214,663 5/1993 Kakimoto et al. .
5,323,027 6/1994 Yamada et al. ........................... 257/96

FOREIGN PATENT DOCUMENTS

A-0 140 645 5/1985 European Pat. Off. .
A-0 516 162 12/1992 European Pat. Off. .

Primary Examiner—Jerome Jackson
Assistant Examiner—Nathan K. Kelley
Attorney, Agent, or Firm—Barnes & Thornburg

[57] ABSTRACT

A light emitting device with higher luminance than that of a conventional light emitting device is provided. According to the present invention, a light emitting device comprises owing three layers of: a first cladding layer made of a p-type mixed crystal compound semiconductor; a p-type active layer made of a p-type mixed crystal compound semiconductor which has the mixed crystal ratio required to emit the light having a predetermined wavelength; and a second cladding layer made of a mixed crystal compound semiconductor, the conductivity type of which is n throughout the second cladding layer or except the region in the vicinity of the heterojunction with the p-type active layer, wherein the p-type active layer is sandwiched by the first cladding layer and the second cladding layer, and forms the double hetrojunction structure with said both cladding layers, and is characterized in that: the second cladding layer is doped with an n-type impurity or impurities and a p-type impurity or impurities; the total concentration of a p-type impurity or impurities in the second cladding layer is in the range of $1\times10^{17}$ cm$^{-3}$ and more; and a pn junction is formed in the second cladding layer of a position within 1 $\mu$m from the heterojunction with the p-type active layer.

12 Claims, 5 Drawing Sheets

LIGHT EMITTING DEVICE

BACKGROUND OF THE INVENTION

1. Field of the Invention

The present invention relates to a light emitting device, and in more particular to a light emitting device with a double heterojunction structure.

2. Related Prior Art

Light emitting devices are semiconductor devices which emit visible or infrared light when forward currents are supplied across the pn junction thereof.

Some of them are used as point light sources for pilot lamps and the like, and others are also used as light sources in optical communication systems. Their applications are expanding more and more.

In general, a light emitting device has a three-layer double heterojunction structure, in which an active layer is sandwiched by a set of cladding layers.

The device is completed by forming electrodes on both sides of this three-layer double heterojunction structure. Each of the three layers is made of semiconductor, for which III–V group compound semiconductors are mainly used for current commercial purposes.

Among the III–V group compound semiconductors, GaAlAs semiconductors are selectively used for light emitting devices of high luminance applications because they provide especially higher luminance.

The light emitting devices mentioned above are produced, for example, by forming a three-layer double heterojunction structure on a GaAs substrate by means of a epitaxial growth method.

As the epitaxial growth method, either a vapor phase epitaxial growth method or a liquid phase epitaxial growth method can be used. The liquid phase epitaxial growth method is more often used because it provides growth layers with better crystallinity.

As the applications of light emitting devices broaden, those with higher luminance are increasingly demanded.

The conventional light emitting device mentioned above, however, cannot provide enough luminance. Development of a light emitting device with higher luminance has therefore been desired.

SUMMARY OF THE INVENTION

It is an object of the present invention, accordingly, to provide a light emitting device with higher luminance than that of a conventional light emitting device.

A light emitting device claimed in claim 1 of the present invention is a light emitting device comprising the following three layers of:

- a first cladding layer made of a p-type mixed crystal compound semiconductor;
- a p-type active layer made of a ptype mixed crystal compound semiconductor, which has the mixed crystal ratio required to emit the light having a predetermined wavelength; and
- a second cladding layer made of a mixed crystal compound semiconductor, the conductivity type of which is n throughout the second cladding layer or except the region in the vicinity of the heterojunction with the p-type active layer, wherein the p-type active layer is sandwiched by the first cladding layer and the second cladding layer, and forms the double hetrojunction structure with both cladding layers, and is characterized in that:

- the second cladding layer is doped with an impurity or impurities of n-type and an impurity or impurities of p-type;
- the total concentration of a p-type impurity or impurities in the second cladding layer is in the range of $1 \times 10^{17}$ cm$^{-3}$ and more; and
- a pn junction is formed in the second cladding layer of a position within 1 $\mu$m from the heterojunction with p-type active layer.

A light emitting device claimed in claim 2 is a light emitting device, characterized in that the p-type impurity concentration of said p-type active layer is $1 \times 10^{17}$ cm$^{-3}$ and more.

A light emitting device claimed in claim 3 is a light emitting device, characterized in that the p-type impurity concentration $P_P$ of said first cladding layer in the vicinity of the heterojunction with said p-type active layer is equal to or less than the p-type impurity concentration $P_A$ of said p-type active layer.

A light emitting device claimed in claim 4 is a light emitting device, characterized in that a p-type impurity or impurities doped in said p-type active layer, said first cladding layer and said second cladding layer include at least Zn.

A light emitting device claimed in claim 5 is a light emitting device, characterized in that:

- said first cladding layer is made of a mixed crystal compound semiconductor represented as $Ga_{1-x}Al_xAs$ (where 0<x<1);
- said second cladding layer is made of a mixed crystal compound semiconductor represented as $Ga_{1-z}Al_zAs$ (where 0<z<1); and
- said p-type active layer is made of a mixed crystal compound semiconductor represented as $Ga_{1-y}Al_yAs$ (where 0<y<1).

A light emitting device claimed in claim 6 is a light emitting device, characterized in that said x and z are selected in the range of 0.5 to 0.85 and said y is selected in the range of 0.25 to 0.45.

A light emitting device claimed in claim 7 is a light emitting device, characterized in that the n-type impurity doped in said second cladding layer is selected from Te and Sn.

According to the present invention, the luminance of a light emitting device is improved by controlling the p-type impurity concentration of the n-type second cladding layer in the range of $1 \times 10^{17}$ cm$^{-3}$ and more.

Conventionally, in this n-type second cladding layer, n-type impurity or impurities such as Te and the like were doped in order to attain n-type conductivity therein but p-type impurity or impurities have never been doped intentionally.

The level of the p-type impurity concentration in the second cladding layer, therefore, is of the order of spontaneous contamination from carbonaceous parts except the diffusion of p-type impurities from the p-type active layer. In general, the concentration was less than $1 \times 10^{17}$ cm$^{-3}$.

However, it has been confirmed by the inventors that the luminance of a light emitting device is unexpectedly improved in the conditions that the concentration of the p-type impurity or impurities in the n-type second cladding layer is $1 \times 10^{17}$ cm$^{-3}$ and more.

Regarding the reasoning for this fact, it is so considered that the size effect of Zn atoms in the crystal lattice shows up by increasing the concentration of a p-type impurity of or impurities inclusive of Zn in the second cladding layer and the positive effects such as decreasing crystallographic defects comes to prevail due to the size effect of Zn, so that the effect of improving the luminance is resulted.

BRIEF DESCRIPTION OF THE DRAWINGS

The present invention will be explained in more detail in conjunction with appended drawings, wherein.

DETAILED DESCRIPTION OF THE INVENTION

An embodiment of the present invention will be described below in reference to the accompanying drawings.

Figure 1:
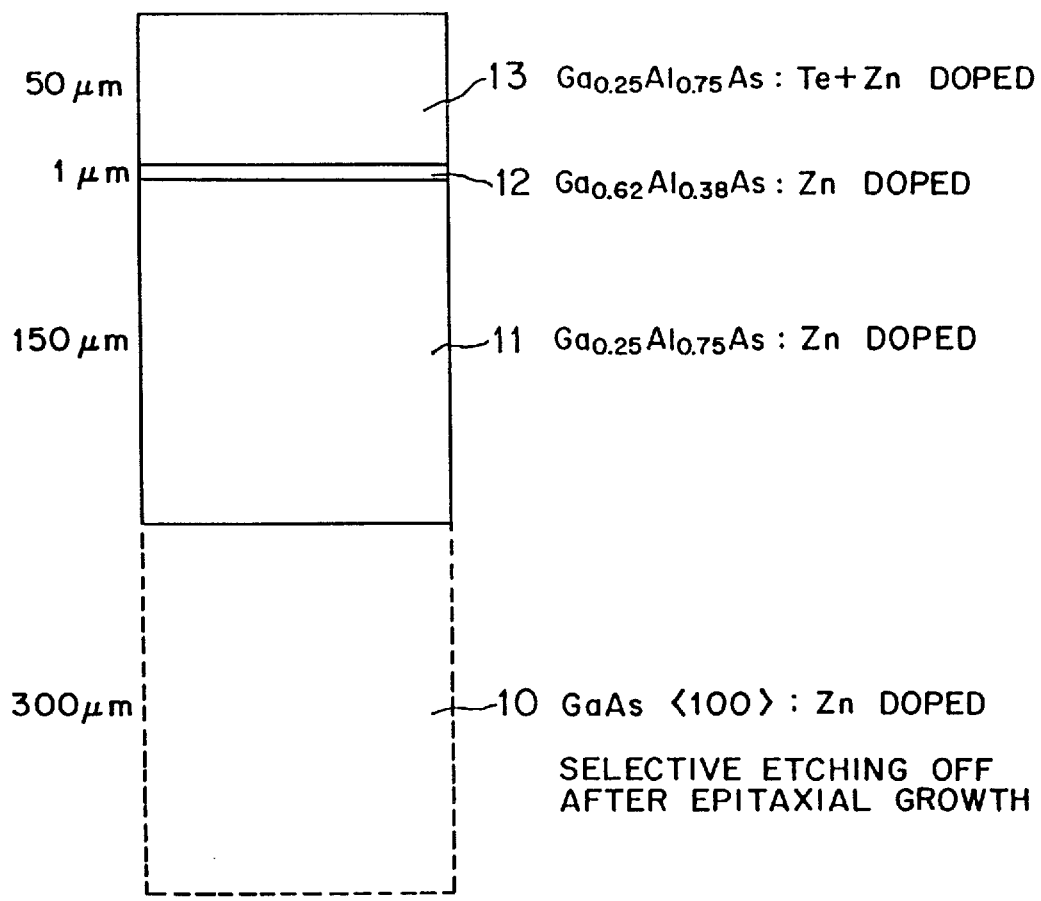
FIG. 1 is a view showing the depth-wise structure of an embodiment of the light emitting device according to the present invention.

FIG. 1 is a view showing the depth-wise structure of an embodiment of the light emitting device according to the present invention.

In this figure, three epitaxial growth layers constituting a light emitting device according to the present invention, are formed on a p-type <100> GaAs substrate 10 which is doped with Zn as p-type impurity at a concentration of approximately $1 \times 10^{19} cm^{-3} \sim 3 \times 10^{19} cm^{-3}$.

In more particular, the following three layers are sequentially grown on the p-type GaAs substrate 10 by means of an epitaxial growth method, which are:
 a p-type cladding layer 11 of 150 μm thick made of $Ga_{0.25}Al_{0.75}As$ mixed crystal compound semiconductor doped with Zn as p-type impurity in a manner such that the concentration is distributed in a predetermined depth-wise profile;
 a p-type active layer 12 of 1 μm thick made of $Ga_{0.62}Al_{0.38}As$ mixed crystal compound semiconductor doped with Zn as p-type impurity to have the concentration of $1 \times 10^{17} cm^{-3}$ and more; and
 an n-type cladding layer 13 of 50 μm thick made of $Ga_{0.25}Al_{0.75}As$ mixed crystal compound semiconductor doped with both Te as n-type impurity and Zn as p-type impurity.

The p-type GaAs substrate 10 is removed by selective etching, if necessary, after forming the three epitaxial growth layers.

Next, an example of the processes for producing the light emitting device of an embodiment according to the present invention will be explained referring to FIG. 2.

The light emitting device of the embodiment can be produced by growing each of the layers by means of a liquid phase epitaxial growth method.

Here, an example of the slide boat method, in which a slide boat is used, is shown and the gradual cooling method is adopted, in which the temperature is gradually lowered for growing.

In FIG. 2, the p-type GaAs substrate 10 is fixed in the recess of the upper surface of a boat body 20 in such a manner that the upper surface of the substrate 10 is flush with the upper surface of the boat body 20.

A sliding solution reservoir 21, which is slidable on the boat body 20, has:
 a first solution reservoir 22 holding a Ga solution 22a for growing the p-type cladding layer,
 a second solution reservoir 23 holding a Ga solution 23a for growing the p-type active layer, and
 a third solution reservoir 24 holding a Ga solution 24a for growing the n-type cladding layer.

Each reservoir has no bottom and thus the solution in each reservoir directly contacts the upper surface of the boat body 20.

The Ga solution 22a for growing the p-type cladding layer is the Ga solution resolving $Ga_{0.25}Al_{0.75}As$ with Zn added as p-type impurity.

The Ga solution 24a for growing the n-type cladding layer is the Ga solution resolving $Ga_{0.25}Al_{0.75}As$ with both Zn as p-type impurity and Te as n-type impurity.

The Ga solution 23a for growing the p-type active layer is the Ga solution resolving $Ga_{0.62}Al_{0.38}As$ with Zn as p-type impurity.

The sliding solution reservoir 21 is adapted to be moved by operating an actuating rod 25.

A process for forming three epitaxial growth layers on the p-type GaAs substrate 10 according to the aforementioned apparatus will be described below.

Figure 2A:
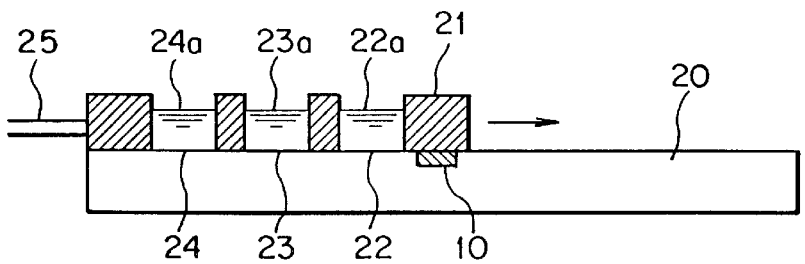
FIGS. 2(a)–(c) are an explanatory view showing an example of processes for producing a light emitting device according to the present invention.
Figure 2B:
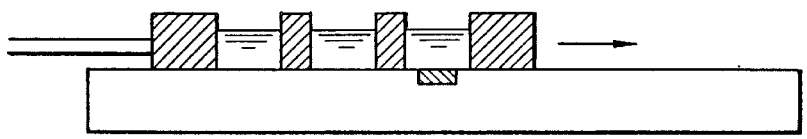
Figure 2C:
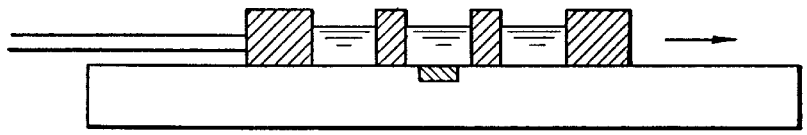
Figure 2D:
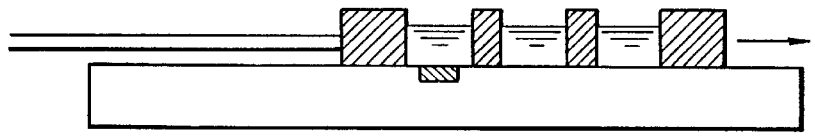

The sliding solution reservoir 21 is slided by using the actuating rod 25 in the arrowed direction from the position shown in FIG. 2(a) to set the Ga solution 22a for growing the p-type cladding layer 11 held in the first solution reservoir 22 on the p-type GaAS substrate 10, and the p-type cladding layer 11 is grown on the substrate 10 under a condition that the temperature is lowered, for example, from 900° C. to 800 ° C. ( FIG. 2(b)).

Then, the sliding solution reservoir 21 is further slided in the arrowed direction to set the Ga solution 23a for growing the p-type active layer 12 held in the second solution reservoir 23 on the p-type GaAs substrate 10, and the p-type active layer 12 is grown on the p-type cladding layer 11 under a condition that the temperature is lowered, for example, from 800° C. to 795 ° C. (FIG. 2(c)).

The sliding solution reservoir 21 is still further slided in the arrowed direction to set the Ga solution 24a for growing the n-type cladding layer 13 held in the third solution reservoir 24 on the p-type GaAs substrate 10, and the n-type cladding layer 13 is grown on the p-type active layer 12 under a condition that the temperature is lowered, for example, from 795° C. to 650 ° C. ( FIG. 2(d) ).

Figure 2E:
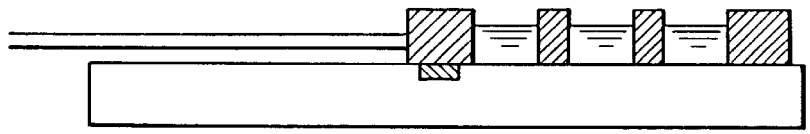

Thereafter, the sliding solution reservoir 21 is still further slided in the arrowed direction to complete the whole process for growth (FIG. 2(e)).

In the above-mentioned process, Te and Zn are both added in the Ga solution 24a for growing the n-type cladding layer wherein Zn is doped in such an extent that the Zn concentration doped in the n-type cladding layer 13 is $1 \times 10^{17} cm^{-3}$ and more and the conductivity type of the n-type cladding layer 13, however, maintains to be n.

In a heat treatment after that, the highly doped Zn in the p-type active layer 12 diffuses into the side of the n-type cladding layer 13 and thus the region thereof adjacent to the p-type active layer 12, which has a thickness of 1 μm or less, has a chance to become p-type.

After preparation of the three-layer double heterojunction structure on the p-type GaAs substrate 10 as described above, the substrate 10 is removed by selective etching and electrodes are formed on the both sides of the three-layer structure to complete a light emitting device.

Figure 3:
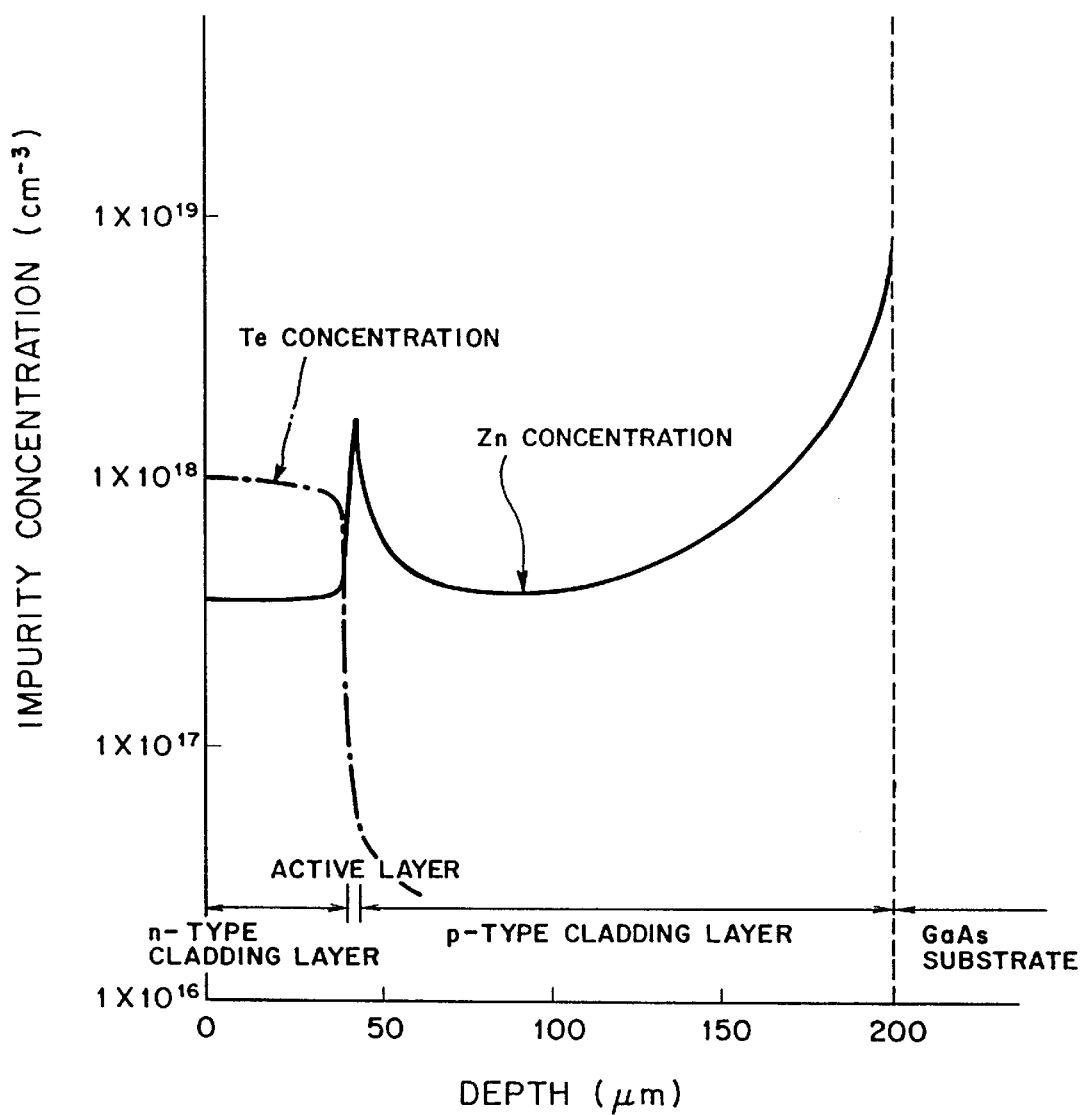
FIG. 3 is a graph showing the depth-wise impurity concentration profile of an embodiment of the light emitting device according to the present invention.

FIG. 3 shows the depth-wise impurity concentration profile of the light emitting device produced by the manner as mentioned above.

The concentration of the intentionally-doped Zn in the n-type cladding layer 13 is $1 \times 10^{17}$ cm$^{-3}$ and more, and the concentration of Te in the n-type cladding layer 13 is approximately $1 \times 10^{18}$ cm$^{-3}$ in the vicinity of the surface, and, in the region adjacent to the p-type active layer 12, is lowered down to approximately $7 \times 10^{17}$ cm$^{-3}$, but the entire n-type cladding layer 13 maintains to be n-type.

The Zn concentration of the p-type cladding layer 12 is $1 \times 10^{17}$ cm$^{-3}$ and more.

The concentration of Zn in the p-type cladding layer 11 is profiled in such a manner that the concentration is lower in the region adjacent to the p-type active layer 12 than that of Zn in the p-type active layer 12 and becomes higher with increase in the distance from the p-type active layer 12.

Figure 4:
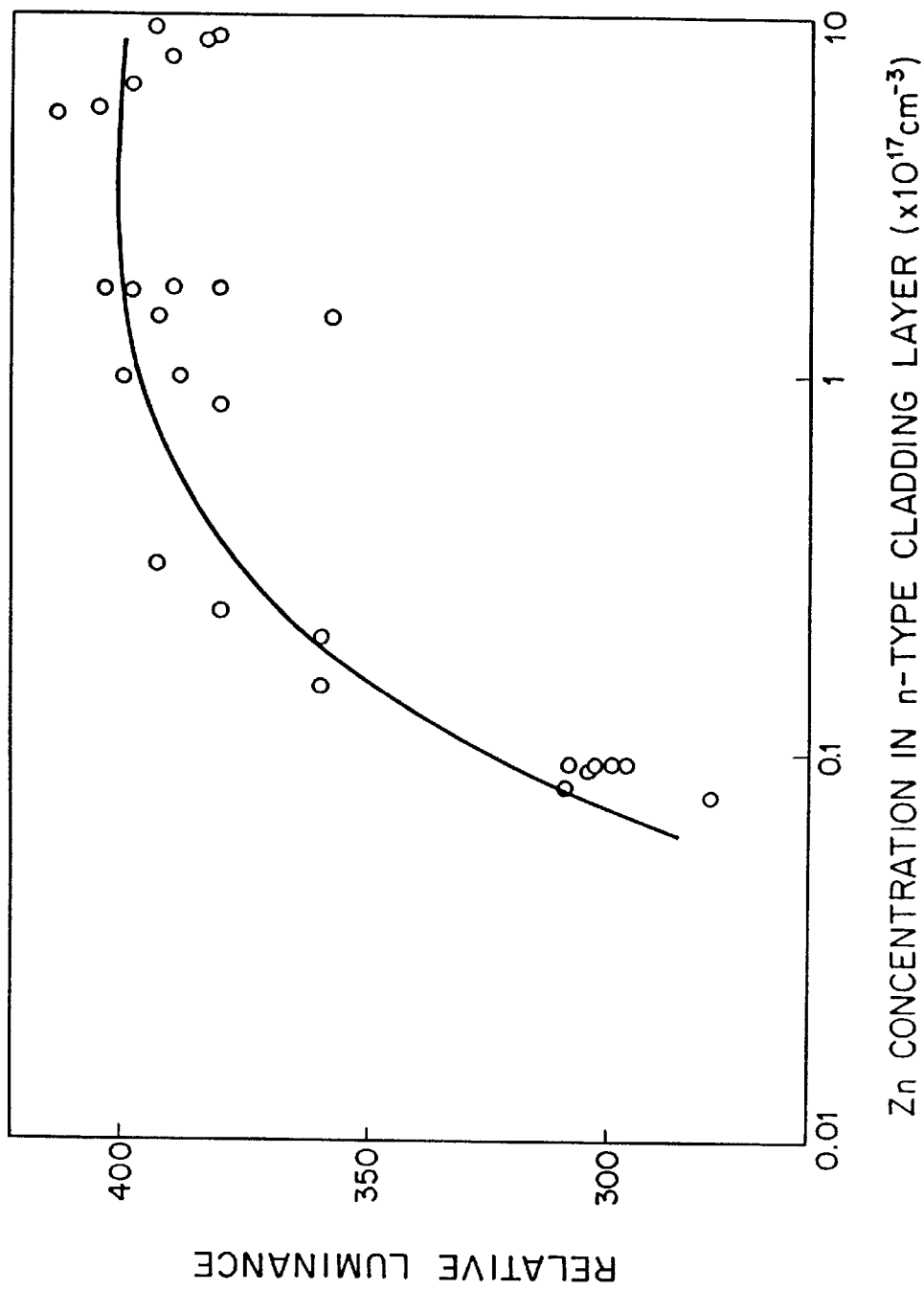
FIG. 4 is a graph showing the relationship between the Zn concentration of the n-type cladding layer and the relative luminance of the light emitting device according to the present invention.

FIG. 4 shows the relationship between the Zn concentration of the n-type cladding layer and the relative luminance of the light emitting device according to the present invention.

It is seen from the figure that the relative luminance of the light emitting device becomes larger with increase in the Zn concentration of the n-type cladding layer 13.

Figure 5:
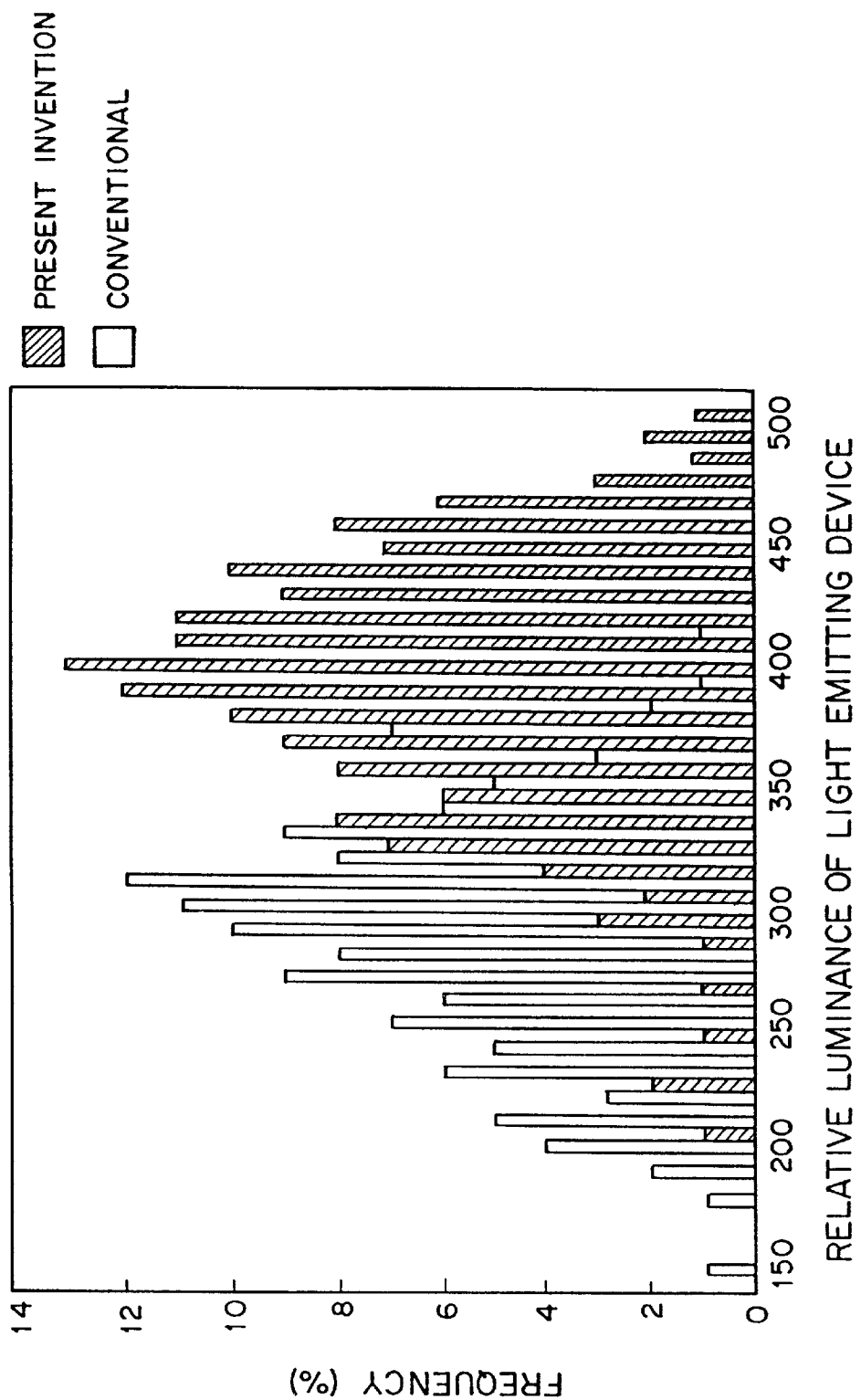
FIG. 5 is graphs showing the frequency distribution of each set of the relative luminances
 of an embodiment of the light emitting device according to the present invention, where the Zn concentration of the n-type cladding layer is $1 \times 10^{17} cm^{-3} \sim 5 \times 10^{17} cm^{-3}$, and
 of a conventional light emitting device, where the Zn concentration of the n-type cladding layer is $1 \times 10^{16} cm^{-3} \sim 5 \times 10^{16} cm^{-3}$.

FIG. 5 is graphs showing the frequency distribution of each set of the relative luminances
of an embodiment of the light emitting device according to the present invention, where the Zn concentration of the n-type cladding layer 13 is $1 \times 10^{17}$ cm$^{-3}$~$5 \times 10^{17}$ cm$^{-3}$, and of a conventional light emitting device, where the Zn concentration of the n-type cladding layer 13 is $1 \times 10^{16}$ cm$^{-3}$~$5 \times 10^{16}$ cm$^{-3}$ In the embodiment, it is found that the light emitting device according to the present invention shows typically such an extremely high value as approximately 400 in relative luminance.

By the way, the luminance of the product operated at m cd/20 mA is roughly equal to the value of the relative luminance multiplied by 8.

In the above description, an embodiment according to the present invention has been explained. It should be understood, however, that the present invention is not limited to the embodiment, but a variety of modifications thereof can be made in the present invention without departing from the spirit and the scope thereof.

For examples, as p-type impurities doped in the n-type cladding layer 13, combinations of Zn, Mg, C and the like instead of a single Zn maybe doped and as n-type impurities doped in the n-type cladding layer 13, Sn or a combination of Te and Sn instead of a single Te may also be adopted.

According to the present invention, as described above, the light emitting device comprising the following three layers of:
the first cladding layer made of the p-type mixed crystal compound semiconductor;
the p-type active layer made of the p-type mixed crystal compound semiconductor, which has the required mixed crystal ratio for a predetermined wavelength of emission; and
the second cladding layer made of the mixed crystal compound semiconductor, the conductivity type of which is n throughout the second cladding layer or except the region in the vicinity of the heterojunction between the second cladding layer and the p-type active layer,
wherein the p-type active layer is sandwiched by the first cladding layer and the second cladding layer and forms double heterojunction structure with both cladding layers, characterized in that:
an n-type impurity or impurities and a p-type impurity or impurities are doped in the second cladding layer;
the total concentration of the p-type impurity or impurities in the second cladding layer are $1 \times 10^{17}$ cm$^{-3}$ and more; and
the pn junction is formed in the second cladding layer of a position within 1 μm from the hetrojunction with the p-type active layer, has a higher luminance than that of a conventional light emitting device.

We claim:
1. A light emitting device comprising the following three layers of:
a first cladding layer made of a p-type mixed crystal compound semiconductor;
a p-type active layer made of a p-type mixed crystal compound semiconductor which has a mixed crystal ratio required to emit the light having a predetermined wavelength; and
a second cladding layer made of a mixed crystal compound semiconductor, the conductivity type of which is n-type except at a region in the vicinity of the heterojunction with said p-type active layer or entirely n-type wherein:
said p-type active layer is sandwiched by said first cladding layer and said second cladding layer and forms a double heterojunction structure with both said cladding layers;
said second cladding layer is doped throughout with Te and Zn;
the total concentration of Zn in the second cladding layer is in the range of $1 \times 10^{17}$ cm$^{-3}$ or more; and
a pn junction is bounded by the second cladding layer at a position within 1 μm from the heterojunction with the p-type active layer.

2. A light emitting device according to claim 1, wherein the p-type impurity concentration of said p-type active layer is $1 \times 10^{17}$ cm$^{-3}$ or more.

3. A light emitting device according to claim 1, wherein the p-type impurity concentration $P_P$ of said first cladding layer in a region adjacent to the heterojunction with said p-type active layer is equal to or less than the p-type impurity concentration $P_A$ of said p-type active layer.

4. A light emitting device according to claim 2, wherein the p-type impurity concentration $P_P$ of said first cladding layer in a region adjacent to the heterojunction with said p-type active layer is equal to or less than the p-type impurity concentration $P_A$ of said p-type active layer.

5. A light emitting device according to claim 1, wherein:
said first cladding layer is made of a mixed crystal compound semiconductor represented as $Ga_{1-x}Al_xAs$ (where 0<x<1);
said second cladding layer is made of a mixed crystal compound semiconductor represented as $Ga_{1-z}Al_zAs$ (where 0<z<1); and said p-type active layer is made of a mixed crystal compound semiconductor represented as $Ga_{1-y}Al_yAs$ (where 0<y<1).

6. A light emitting device according to claim 2, wherein:

said first cladding layer is made of a mixed crystal compound semiconductor represented as $Ga_{1-x}Al_xAs$ (where 0<x<1);

said second cladding layer is made of a mixed crystal compound semiconductor represented as $Ga_{1-z}Al_zAs$ (where 0<z<1); and said p-type active layer is made of a mixed crystal compound semiconductor represented as $Ga_{1-y}Al_yAs$ (where 0<y<1).

7. A light emitting device according to claim 3, wherein:

said first cladding layer is made of a mixed crystal compound semiconductor represented as $Ga_{1-x}Al_xAs$ (where 0<x<1);

said second cladding layer is made of a mixed crystal compound semiconductor represented as $Ga_{1-z}Al_zAs$ (where 0<z<1); and said p-type active layer is made of a mixed crystal compound semiconductor represented as $Ga_{1-y}Al_yAs$ (where 0<y<1).

8. A light emitting device according to claim 4, wherein said first cladding layer is made of a mixed crystal compound semiconductor represented as $Ga_{1-x}Al_xAs$ (where 0<x<1);

said second cladding layer is made of a mixed crystal compound semiconductor represented as $Ga_{1-z}Al_zAs$ (where 0<z<1); and said p-type active layer is made of a mixed crystal compound semiconductor represented as $Ga_{1-y}Al_yAs$ (where 0<y<1).

9. A light emitting device according to claim 5, wherein said x and z are selected in the range of 0.5 to 0.85 and said y is selected in the range of 0.25 to 0.45.

10. A light emitting device according to claim 6, wherein said x and z are selected in the range of 0.5 to 0.85 and said y is selected in the range of 0.25 to 0.45.

11. A light emitting device according to claim 7, wherein said x and z are selected in the range of 0.5 to 0.85 and said y is selected in the range of 0.25 to 0.45.

12. A light emitting device according to claim 8, wherein said x and z are selected in the range of 0.5 to 0.85 and said y is selected in the range of 0.25 to 0.45.

* * * * *